United States Patent
Lo et al.

(10) Patent No.: US 11,616,050 B2
(45) Date of Patent: Mar. 28, 2023

(54) MANUFACTURING METHOD OF MICRO LIGHT EMITTING DIODE DEVICE INCLUDING DIFFERENT-TYPE EPITAXIAL STRUCTURES HAVING RESPECTIVE CONNECTION PORTIONS OF DIFFERENT THICKNESSES

(71) Applicant: PlayNitride Inc., Hsinchu County (TW)

(72) Inventors: Yu-Yun Lo, Hsinchu County (TW);
Tzu-Yang Lin, Hsinchu County (TW);
Yu-Hung Lai, Hsinchu County (TW)

(73) Assignee: PlayNitride Inc., Hsinchu County (TW)

(*) Notice: Subject to any disclaimer, the term of this patent is extended or adjusted under 35 U.S.C. 154(b) by 20 days.

(21) Appl. No.: 17/356,538

(22) Filed: Jun. 24, 2021

(65) Prior Publication Data
US 2021/0320090 A1  Oct. 14, 2021

Related U.S. Application Data

(62) Division of application No. 15/803,864, filed on Nov. 6, 2017, now Pat. No. 11,094,675.

(30) Foreign Application Priority Data

Aug. 8, 2017 (CN) .......................... 201710685744.5

(51) Int. Cl.
| H01L 25/075 | (2006.01) |
| H01L 33/62  | (2010.01) |
| H01L 25/00  | (2006.01) |
| H01L 33/00  | (2010.01) |
| H01L 33/38  | (2010.01) |
| H01L 33/44  | (2010.01) |

(52) U.S. Cl.
CPC .......... *H01L 25/0753* (2013.01); *H01L 25/50* (2013.01); *H01L 33/0093* (2020.05); *H01L 33/62* (2013.01); *H01L 33/382* (2013.01); *H01L 33/44* (2013.01); *H01L 2933/0066* (2013.01)

(58) Field of Classification Search
CPC . H01L 25/0753; H01L 25/50; H01L 33/0079; H01L 33/62
USPC .......................................................... 257/88
See application file for complete search history.

(56) References Cited

U.S. PATENT DOCUMENTS

2004/0259331 A1* 12/2004 Ogihara .............. H01L 33/0093
                                                           438/462
2018/0366450 A1* 12/2018 Gardner .................. H01L 25/50

* cited by examiner

*Primary Examiner* — Matthew E. Gordon
(74) *Attorney, Agent, or Firm* — JCIPRNET

(57) ABSTRACT

A method for manufacturing a micro light emitting diode device is provided. A plurality of first type epitaxial structures are formed on a first substrate and the first type epitaxial structures are separated from each other. A first connection layer and a first adhesive layer are configured between the first type epitaxial structures and the first substrate. The first connection layer is connected to the first type epitaxial structures. The first adhesive layer is located between the first connection layer and the first type epitaxial substrate. The Young's modulus of the first connection layer is larger than the Young's modulus of the first adhesive layer. The first connection layer located between any two adjacent first type epitaxial structures is removed so as to form a plurality of first connection portions separated from each other. Each of the first connection portions is connected to the corresponding first type epitaxial structure.

11 Claims, 15 Drawing Sheets

MANUFACTURING METHOD OF MICRO LIGHT EMITTING DIODE DEVICE INCLUDING DIFFERENT-TYPE EPITAXIAL STRUCTURES HAVING RESPECTIVE CONNECTION PORTIONS OF DIFFERENT THICKNESSES

CROSS-REFERENCE TO RELATED APPLICATION

This application is a divisional application of and claims the priority benefit of U.S. application Ser. No. 15/803,864, filed on Nov. 6, 2017, now allowed, which claims the priority benefit of China application serial no. 201710685744.5, filed on Aug. 8, 2017. The entirety of each of the above-mentioned patent applications is hereby incorporated by reference herein and made a part of this specification.

BACKGROUND OF THE INVENTION

Field of the Invention

The invention is related to a light emitting device and a manufacturing method thereof, and particularly to a micro light emitting diode device and a manufacturing method thereof.

Description of Related Art

Existing manufacturing steps of micro light emitting diode device are carried out as follows. First of all, a plurality of epitaxial structures are formed on a growth substrate, and a required electrode is formed on each of the epitaxial structures. A first adhesive layer is formed on the growth substrate to cover each of the epitaxial structures and the electrode thereof. Thereafter, the first substrate is adhered to the first adhesive layer and the growth substrate is removed. At this point, relative positions of the epitaxial structures are fixed by the first adhesive layer. Subsequently, a second substrate is adhered to the epitaxial structures and the first adhesive layer via a second adhesive layer. Lastly, the epitaxial structures are transferred to a circuit substrate.

In the process where the second substrate is adhered to the first adhesive layer via the second adhesive layer, it is required that the second adhesive layer is heated and the second substrate is laminated with the second adhesive layer. At this point, the first adhesive layer that is subjected to heat or force begins to flow and causes impact on the epitaxial structures; as a result, the relative positions of the epitaxial structures are shifted. That is to say, when the epitaxial structures are transferred to the circuit substrate, the defects generated in the above-described manufacturing steps cause the electrodes on each of the epitaxial structures unable to be precisely aligned with the electrical point on the circuit substrate, which affects the manufacturing efficiency, yield of rate and reliability of product.

SUMMARY OF THE INVENTION

The invention provides a micro light emitting diode device which has good reliability.

The invention provides a manufacturing method of a micro light emitting diode device which is capable of improving manufacturing efficiency and yield of rate.

The manufacturing method of the micro light emitting diode device of the invention includes the following manufacturing steps. (a) A plurality of first type epitaxial structures are formed on a first substrate, and the first type epitaxial structures are separated from each other, wherein a first connection layer and a first adhesive layer are configured between the first type epitaxial structures and the first substrate. The first connection layer is connected to the first type epitaxial structures, and the first adhesive layer is located between the first connection layer and the first substrate, wherein the Young's modulus of the first connection layer is larger than the Young's modulus of the first adhesive layer. (b) The first connection layer located between any two adjacent first type epitaxial structures is removed so as to form a plurality of first connection portions separated from each other, wherein each of the first connection portions is connected to a corresponding first type epitaxial structure respectively.

In an embodiment of the invention, the manufacturing method of the micro light emitting diode device further includes (c) bonding a portion of the first type epitaxial structures to a target substrate electrically.

In an embodiment of the invention, the manufacturing method of the micro light emitting diode device further includes (d) forming a plurality of second type epitaxial structures on a second substrate and the second type epitaxial structures are separated from each other, wherein a second connection layer and a second adhesive layer are configured between the second type epitaxial structures and the second substrate. The second connection layer is connected to the second type epitaxial structures, and the second adhesive layer is located between the second connection layer and the second substrate, wherein the Young's modulus of the second connection layer is larger than the Young's modulus of the second adhesive layer; (e) removing the second connection layer located between any two adjacent second type epitaxial structures so as to form a plurality of a second connection portions separated from each other, wherein each of the second connection portions is connected to a corresponding second type epitaxial structure respectively.

In an embodiment of the invention, the manufacturing method of the micro light emitting diode device further includes (f) bonding a portion of the first type epitaxial structures in step (b) to the target substrate electrically; (g) bonding a portion of the second type epitaxial structures in step (e) to the target substrate electrically.

In an embodiment of the invention, a total thickness of each of the first type epitaxial structures and the corresponding first connection portion is smaller than or equal to a total thickness of each of the second type epitaxial structures and the corresponding second connection portion.

In an embodiment of the invention, a ratio of the thickness of each of the first connection portions to the thickness of the corresponding first type epitaxial structure is larger than 0.01 and smaller than or equal to 0.5.

In an embodiment of the invention, a ratio of the thickness of each of the first connection layers to a side length of the corresponding first type epitaxial structure is larger than 0.001 and smaller than or equal to 0.3.

In an embodiment of the invention, in the step (b), the first connection layer located between any two adjacent first type epitaxial structures is removed via an etching process so as to form the first connection portions separated from each other.

In an embodiment of the invention, in the step (a), the method of forming the first type epitaxial structures on the first substrate includes (a-1) forming the first type epitaxial structures separated from each other on a first growth carrier; (a-2) removing the first growth carrier; (a-3) forming the first connection layer and the first adhesive layer so as to bond the first type epitaxial structures and the first substrate together via the first adhesive layer.

In an embodiment of the invention, a step is further included between the step (a-1) and the step (a-2): (a-1-1) forming a temporary fixing layer so as to bond the first type epitaxial structures to a temporary substrate, wherein a bonding force between the temporary fixing layer and the temporary substrate is smaller than a bonding force between the first adhesive layer and the first substrate.

In an embodiment of the invention, the temporary fixing layer further covers the first type epitaxial structures.

In an embodiment of the invention, in the step (a), the method of forming the first type epitaxial structures on the first substrate includes (a-1) forming the first type epitaxial structures separated from each other on the first growth carrier; (a-2) forming the first connection layer and the first adhesive layer such that the first type epitaxial structures and the first substrate are bonded together via the first adhesive layer; (a-3) removing the first growth carrier.

A micro light emitting diode device of the invention includes a circuit substrate, a plurality of first type epitaxial structures and a plurality of first connection portions. The epitaxial structures are separately disposed on the circuit substrate and electrically connected to the circuit substrate. The first connection portions are respectively and correspondingly disposed on a side of the first type epitaxial structures away from the circuit substrate, wherein a ratio of the thickness of each of the first connection portions to the thickness of the corresponding first type epitaxial structure is larger than or equal to 0.01 and smaller than or equal to 0.5.

In an embodiment of the invention, the micro light emitting diode device further includes a plurality of second type epitaxial structures and a plurality of second connection portions. The second type epitaxial structures are separately disposed on the circuit substrate and electrically connected to the circuit substrate. The second connection portions are respectively and correspondingly disposed on a side of the second type epitaxial structures away from the circuit substrate, wherein a ratio of the thickness of the each of the second connection portions to the thickness of the corresponding second type epitaxial structures is larger than or equal to 0.01 and smaller than or equal to 0.5, and the first type epitaxial structures and the second type epitaxial structures respectively have different colors of light.

In an embodiment of the invention, a total thickness of each of the first type epitaxial structures and the corresponding first connection portion is smaller than a total thickness of each of the second type epitaxial structures and corresponding second connection portion.

In an embodiment of the invention, the thickness of each of the first type epitaxial structures is equal to the thickness of each of the second type epitaxial structures.

In an embodiment of the invention, the thickness of each of the first connection portion is equal to the thickness of each of the second connection portions.

In an embodiment of the invention, the total thickness of each of the first type epitaxial structures and the corresponding first connection portion is equal to the total thickness of each of the second type epitaxial structures and the corresponding second connection portion.

In an embodiment of the invention, the material of the first connection portions is an insulating material.

In an embodiment of the invention, the material of the first connection portions includes silicon nitride, or includes a group consisting of oxides selected from silicon, aluminum, hafnium, zirconium, tantalum and titanium.

In an embodiment of the invention, an orthogonal projection area of each of the first connection portions on the circuit substrate is larger than or equal to an orthogonal projection area of the corresponding first type epitaxial structure on the circuit substrate.

In an embodiment of the invention, the micro light emitting diode device further includes a first insulating layer covering a side wall surface of each of the first type epitaxial structures.

In an embodiment of the invention, the first insulating layer and the first connection portion are formed of the same material, and the density of the first insulating layer is larger than the density of the first connection portion.

In an embodiment of the invention, the first insulating layer and the first connection layer are formed of different materials.

In an embodiment of the invention, a ratio of the thickness of the first connection portion to a side length of the corresponding first type epitaxial structure is larger than or equal to 0.001 and smaller than or equal to 0.3.

In summary, in the manufacturing process of the micro light emitting diode device of the invention, the relative positions of the plurality of first type epitaxial structures may be fixed via the first connection layer; when the first adhesive layer is formed on the first connection layer and first substrate is adhered to the first adhesive layer in the subsequent process, the relative positions of the first type epitaxial structures are not shifted due to the effect of external force. Therefore, when the first type epitaxial structures are transferred to the target substrate, each of the first type epitaxial structures can be precisely aligned onto the target substrate. In other words, the manufacturing method of the micro light emitting diode device of the invention facilitates to improve manufacturing efficiency and yield of rate, and the obtained micro light emitting diode device has good reliability.

In order to make the aforementioned features and advantages of the disclosure more comprehensible, embodiments accompanying figures are described in detail below.

DESCRIPTION OF EMBODIMENTS

FIG. 1 to FIG. 11 are cross-sectional views illustrating a manufacturing method of a micro light emitting diode device according to an embodiment of the invention. First of all, referring to FIG. 1, a plurality of first type epitaxial structures 120a separated from each other are formed on a first growth carrier 100a, wherein the first growth carrier 100a may be a sapphire substrate. In the embodiment, the first type epitaxial structures 120a partially cover one surface of the first growth carrier 100a.

The step of forming the first type epitaxial structures 120a on the first growth carrier 100a is exemplified as follows. First of all, an epitaxial structure layer is formed on the first growth carrier 100a. Here, the step of forming the epitaxial structure layer is described as follows. First of all, a semiconductor material layer is formed on the first growth substrate 100a, and the semiconductor material layer covers one surface of the first growth carrier 100a. The semiconductor material layer may be a multi-layered structure respectively doped with a group IIA element or a group IVA element so as to form a p-type semiconductor layer or an n-type semiconductor layer respectively, or may not be doped with anything; the invention provides no limitation thereto. Subsequently, an active material layer is formed on the semiconductor material layer, and the active material layer covers one surface of the semiconductor material layer. Thereafter, the other semiconductor material layer is formed on the active material layer, and the other semiconductor material layer covers one surface of the active material layer. The semiconductor material layer and the other semiconductor material layer are respectively located on two opposite sides of the active material layer, and the other semiconductor material layer may be a multi-layered structure respectively doped with a group IIA element or a group IVA element so as form the p-type semiconductor layer or the n-type semiconductor layer, or may not be doped with anything; the invention provides no limitation thereto. In the embodiment, the material of the semiconductor material layer, the active material layer and the other semiconductor material layer may be selected from a group II-VI material such as zinc selenide (ZnSe), or a group III-V material such as gallium nitride (GaN); the invention provides no limitation thereto.

Figure 1:
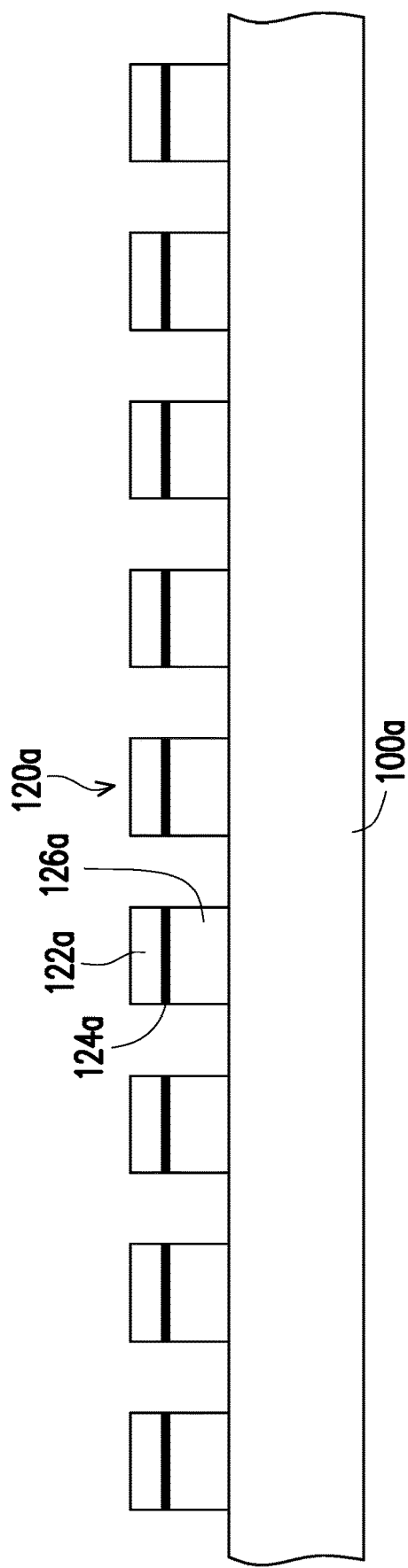
FIG. 1 to FIG. 11 are cross-sectional views illustrating a manufacturing method of a micro light emitting diode device according to an embodiment of the invention.

Lastly, a resist-coating process, an exposing process, a lithographing process and an etching process are performed to pattern the epitaxial structure layer (i.e., the semiconductor material layer, the active material layer and the other semiconductor material layer). In other words, the epitaxial structure layer in a specific region is removed so as to expose a portion of the surface of the first growth carrier 100a, and the portion that is not removed defines the plurality of first type epitaxial structures 120a separated from each other. At this point, as shown in FIG. 1, each of the first type epitaxial structures 120a includes a first type semiconductor layer 122a, a light emitting layer 124a and a second type semiconductor layer 126a. The second type semiconductor layer 126a is connected to the first growth carrier 100a, and the light emitting layer 124a is disposed on the second type semiconductor layer 126a. The first type semiconductor layer 122a is disposed on the light emitting layer 124a, and the first type semiconductor layer 122a and the second type semiconductor layer 126a are respectively located on two opposite sides of the light emitting layer 124a.

Furthermore, the semiconductor material layer doped with the group IIA element or the group IVA element may form the second type semiconductor layer 126a, and the other semiconductor material layer doped with the group IIA element or the group IVA element may form the first type semiconductor layer 122a. If the semiconductor material layer is disposed with the group IVA element such as silicon (Si) and forms the n-type semiconductor layer 122a, then the other semiconductor material layer may be doped with the group IIA element such as magnesium (Mg) and forms the p-type semiconductor layer. On other hand, if the semiconductor material layer is doped with the group IIA element such as magnesium (Mg) and forms the p-type semiconductor layer, then the other semiconductor material layer may be doped with the group IVA element such as silicon (Si) and forms the n-type semiconductor layer. That is to say, the first type semiconductor layer 122a and the second type semiconductor layer 126a may be a combination of the p-type semiconductor layer and the n-type semiconductor layer. On the other hand, the light emitting layer 124a may be a multiple quantum well (MQW) structure formed of the active material layer.

Figure 2:
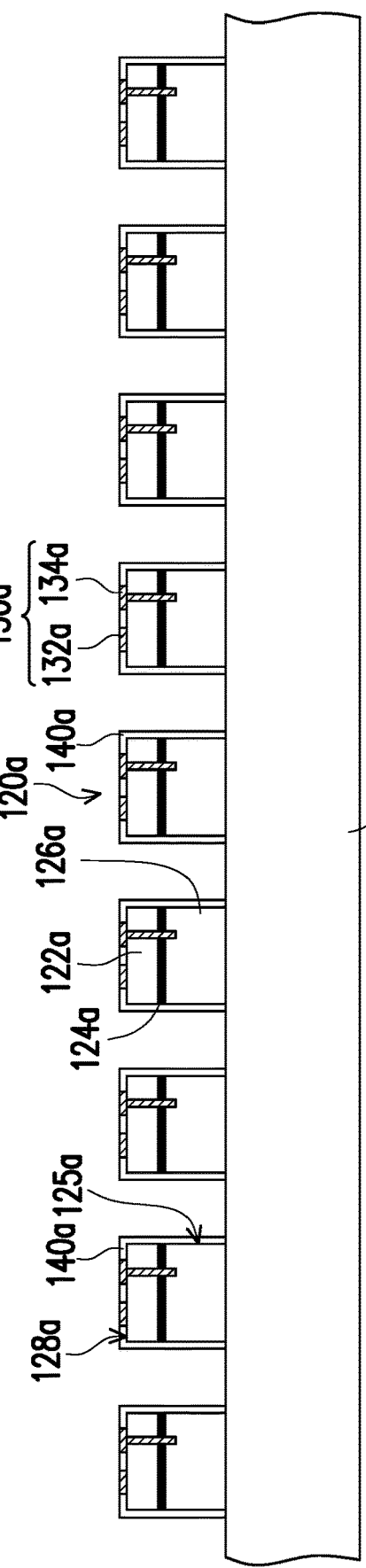

Next, referring to FIG. 2, a pad 130a is formed on each of the first type epitaxial structures 120a, wherein the pads 130a and the first growth carrier 100a are respectively located on two opposite sides of the first type epitaxial structures 120a, and each of the first type epitaxial structures 120a is electrically connected to a corresponding pad 130a.

In the embodiment, the first type epitaxial structures 120a may be a horizontal light emitting diode, wherein each of the pads 130a is disposed on the corresponding first type semiconductor layer 122a, and each of the pads 130a and the corresponding light emitting layer 124a are respectively located on two opposite sides of the corresponding first type semiconductor layer 122a. Each of the pads 130a may include a first type electrode 132a and a second type electrode 134a and the types of electrical properties of the first type electrode 132a and the second type electrode 134a are different from each other, wherein the first type electrode 132a is electrically connected to the first type semiconductor layer 122a, and the second type electrode 134a is electrically connected to the second type semiconductor layer 126a. The first type electrode 132a and the second type electrode 134a may be a combination of the p-type electrode and the n-type electrode. If the first type semiconductor layer 122a is the p-type semiconductor layer and the second type semiconductor layer 126a is the n-type semiconductor layer, then the first type electrode 132a is the p-type electrode and the second type electrode 134a is the n-type electrode. On the other hand, if the first type semiconductor layer 122a is the n-type semiconductor layer, and the second type semiconductor layer 126a is the p-type semiconductor layer, then the first type electrode 132a is the n-type electrode and the second type electrode 134a is the p-type electrode.

In the embodiment, the first type epitaxial structures 120a may be micro light emitting diodes (Micro LED), wherein the maximum width of each of the first type epitaxial structures 120a ranges from about 1 to 100 μm, and preferably ranges from about 3 to 50 μm. On the other hand, the thickness of each of the first type epitaxial structures 120a ranges from about 1 to 6 μm, the thickness that is over-thick or over-slim affects the yield of rate in the subsequent process. In each of the first type epitaxial structures 120a, the thickness of the second type semiconductor layer 126a may be larger than the thickness of the first type semiconductor layer 122a, wherein the thickness of the second type semiconductor layer 126a ranges from about 1 to 5 μm, the thickness of the light emitting layer 124a ranges from about 0.1 to 1 μm, and the thickness of the first type semiconductor layer 122a ranges from about 0.1 to 0.5 μm, which should not be construed as a limitation to the invention. It should be specifically pointed out that a cross-section of the first type epitaxial structure 120a described here is a rectangular shape. However, in another embodiment that is not shown, the cross-section of the first type epitaxial structure may be a trapezoid shape. The invention provides no limitation to the geometrical shape of the cross-section of the first type epitaxial structure.

Referring to FIG. 2, each of the first type epitaxial structures 120a has a side wall surface 125a and a bonding surface 128a connected to each other, wherein the bonding surface 128a is the surface where the pad 130a is disposed, and the side wall surface 125a and the bonding surface 128a may be perpendicular to each other, or an included angle between the side wall surface 125a and the bonding surface 128a may be an obtuse angle, thereby reducing the complexity of the subsequent manufacturing process. In order to prevent moisture from affecting the first type epitaxial structures 120a, it is optional to form a first insulating layer 140a on the bonding surface 128a and the side wall surface 125a of each of the first type epitaxial structures 120a, but each of the first insulating layers 140a exposes the pad 130a on the bonding surface 128a of the corresponding first type epitaxial structure 120a for electrical bonding in the subsequent process. On the other hand, the first insulating layer 140a located on the side wall surface 125a of the first type epitaxial structures 120a is connected to the surface of the first growth carrier 100a located between any two adjacent first type epitaxial structures 120a. Here, the material of the first insulating layer 140a may be silicon nitride or a group consisting of oxides selected from silicon, aluminum, hafnium, zirconium, tantalum and titanium, such as silicon dioxide ($SiO_2$) or aluminum oxide ($Al_2O_3$). In other embodiments, it is optional not to form the first insulating layer on the bonding surface and the side wall surface of the first type epitaxial structures such that the bonding surface and the side wall surface of the first type epitaxial structures are directly exposed to the outside.

Figure 3:
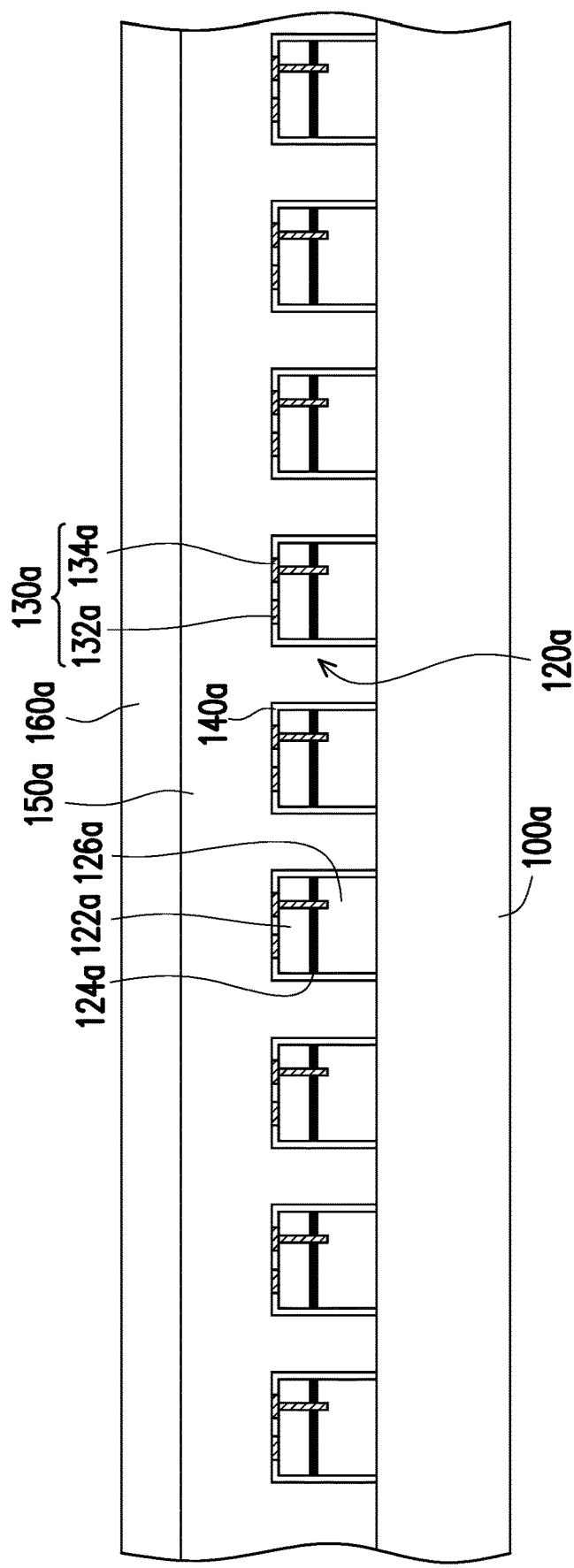

Thereafter, referring to FIG. 3, a temporary fixing layer 150a may be formed on the first growth carrier 100a via a spin-coating process or other proper injecting process, and the temporary fixing layer 150a is further disposed to cover the first type epitaxial structures 120a, the pads 130a and the first insulating layers 140a. In the embodiment, the temporary fixing layer 150a is filled up into a gap between any two adjacent first type epitaxial structures 120a so as to cover the surface of the first growth carrier 100a in the gap. After the temporary fixing layer 150a is formed on the first growth carrier 100a, the temporary substrate 160a is bonded (or adhered to) to the temporary fixing layer 150a, and the temporary substrate 160a and the first growth carrier 100a are respectively located on two opposite sides of the temporary fixing layer 150a. It should be specifically indicated that the temporary substrate 160a and the first growth carrier 100a may be selected from the same material. For example, the temporary substrate 160a and the first growth carrier 100a may be a sapphire substrate so as to avoid deformation during boding process due to difference in thermal expansion coefficient.

Figure 4:
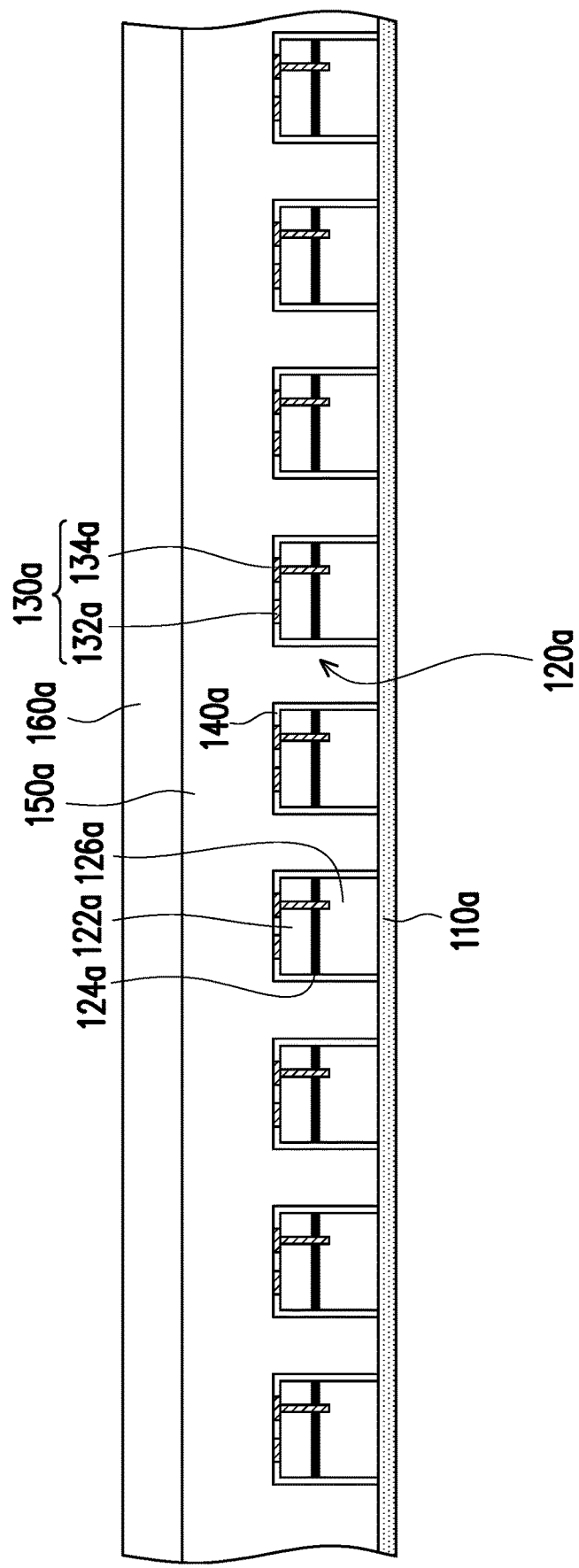
Figure 5:
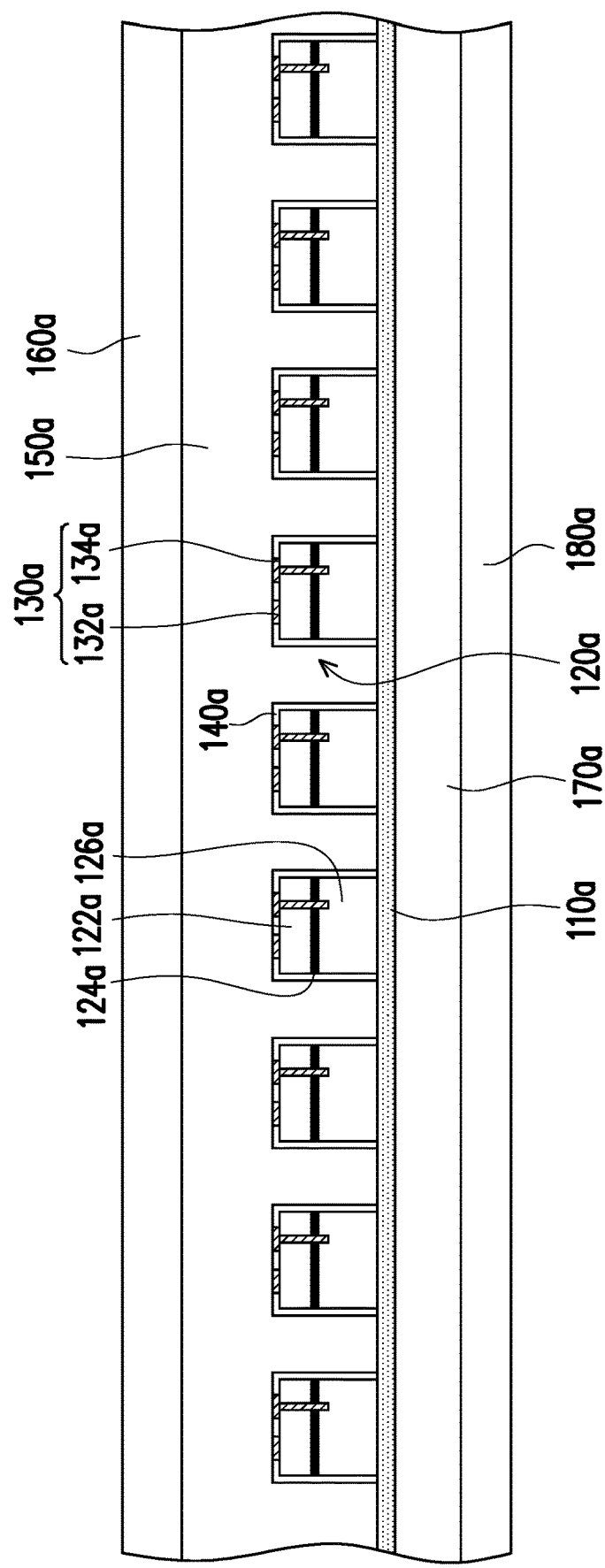

Next, referring to FIG. 4 and FIG. 5, the first growth carrier 100a may be removed via a laser lift-off process or other proper removing process, and the first connection layer 110a is formed on the first type epitaxial structures 120a and the temporary fixing layer 150a, and the first connection layer 110a and the temporary substrate 160a are respectively located on two opposite sides of the temporary fixing layer 150a. With configuration of the first connection layer 110a, the relative positions of the first type epitaxial structures 120a can be fixed. On the other hand, a ratio of the thickness of the first connection layer 110a to the thickness of each of the first type epitaxial structures 120a is larger than 0.01 and smaller than or equal to 0.5. If the ratio is larger than 0.5, it becomes more difficult in the subsequent process to form the plurality of first connection portions separated from each other; if the ratio is smaller than or equal to 0.01, there may not be sufficient bonding force between the first connection layer 110a and each of the first type epitaxial structures 120a. The first connection layer 110a is directly connected to the temporary fixing layer 150a, the first insulating layer 140a and the second type semiconductor layer 126a. The material of the first connection layer 110a may be an insulating material and the melting point thereof is greater than 1000° C. to bear the high temperature and high pressure in the connecting process. For example, the material of the first connection layer 110a may include silicon nitride ($Si_3N_4$), or includes a group consisting of oxides selected from silicon, aluminum, hafnium, zirconium, tantalum and titanium, such as silicon dioxide ($SiO_2$) or aluminum oxide ($Al_2O_3$).

Subsequently, a first adhesive layer 170a may be formed on the first connection layer 110a via a spin-coating process or other proper injecting process, and a first substrate 180a is connected to (or adhered to) the first adhesive layer 170a. In other words, the first substrate 180a may be connected to the first connection layer 110a via the first adhesive layer 170a, and the temporary substrate 160a and the first substrate 180a are respectively located on two opposite sides of the temporary fixing layer 150a. Here, the bonding force between the temporary fixing layer 150a and the temporary substrate 160a is smaller than the bonding force between the first adhesive layer 170a and the first substrate 180a. The melting point of the first connection layer 110a is greater than the melting point of the temporary fixing layer 150a and the first adhesive layer 170a. Since the temporary fixing layer 150a is covered and separated from each other, the relative positions of first type epitaxial structures 120a can be fixed by the first connection layer 110a. Therefore, when the first substrate 180a is connected to the first connection layer 110a via the first adhesive layer 170a, even if the temporary fixing layer 150a flows due to being subjected to heat or force, the relative positions of the first type epitaxial structures 120a are not shifted. Here, the Young's modulus of the first connection layer 110a is larger than the Young's modulus of the first adhesive layer 170a. Other than fixing the relative positions of the first type epitaxial structures 120a to be not easily shifted via the first connection layer 110a that is not easily deformed, the first adhesive layer 170a may also serve as a buffer when the first substrate 180a is connected to the first connection layer 110a. Here, the material of the first adhesive layer 170a is, for example, a polymer. It should be specifically indicated that the first substrate 180a and the temporary substrate 160a may be selected from the same material. For example, the first substrate 180a and the temporary substrate 160a may be a sapphire substrate so as to avoid deformation during the bonding process due to difference in thermal expansion coefficient.

Figure 6:
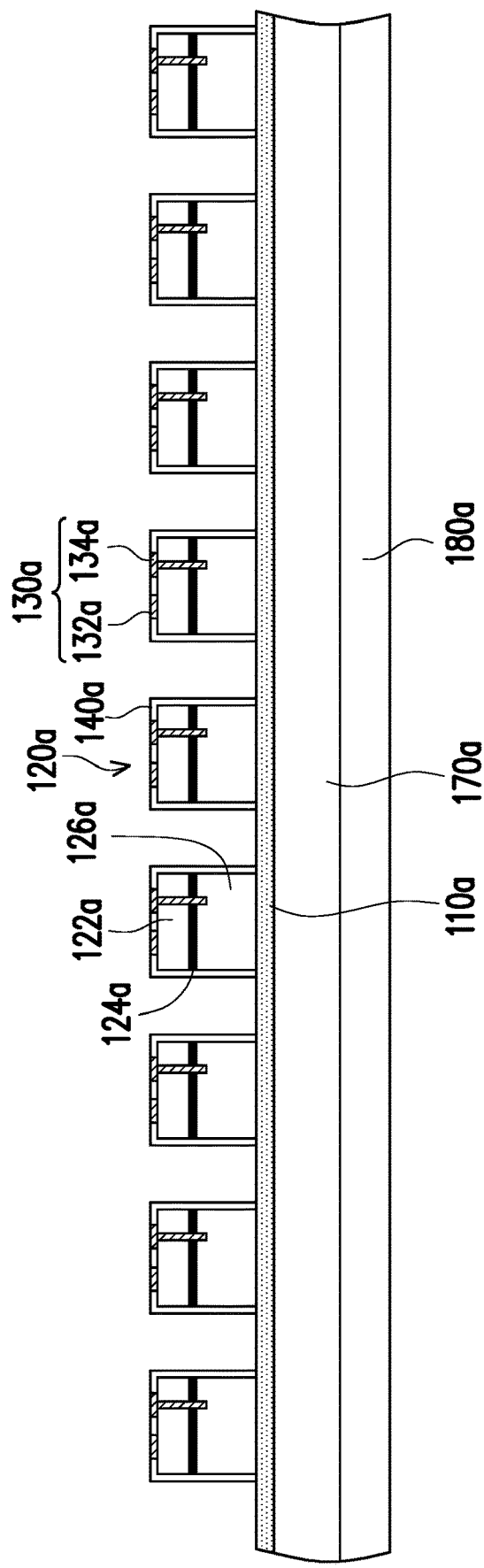

Thereafter, referring to FIG. 6, the temporary substrate 160a may be removed via the laser lift-off process or other proper removing process, and the temporary fixing layer 150a may be removed via a laser ablation process, an ultraviolet exposing process, a solution decomposition process or a heat decomposition process, thereby exposing the pads 130a, the first type epitaxial structures 120a, the first insulating layers 140a and the first connection layer 110a located between any two adjacent first type epitaxial structures 120a. Since the bonding force between the temporary fixing layer 150a and the temporary substrate 160a is smaller than the bonding force between the first adhesive layer 170a and the first substrate 180a, in the removing process, no effect is likely to be caused to the connection between the first adhesive layer 170a and the first substrate 180a.

Figure 7:
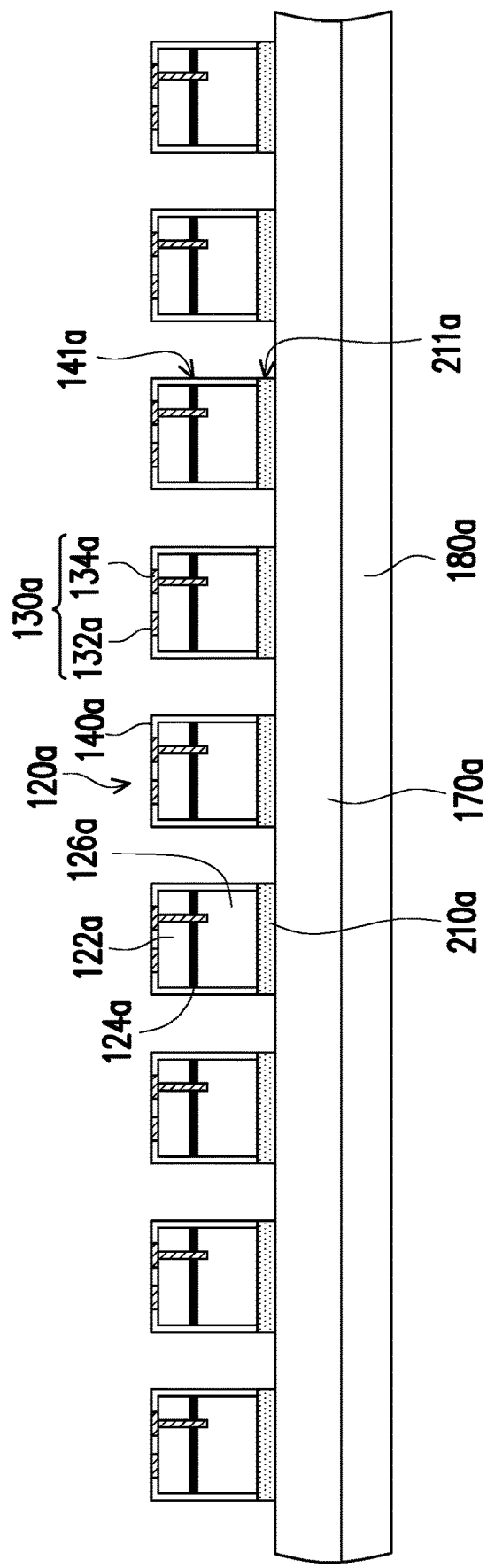

Subsequently, referring to FIG. 6 and FIG. 7, the first connection layer 110a located between any two adjacent first type epitaxial structures 120a may be removed via a wet-etching process or other proper removing process so as to form a plurality of first connection portions 210a separated from each other, and the first connection portions 210a are light-transmittable. In terms of the relative configuration relationship between each of the first type epitaxial structures 120a and the corresponding first connection portion 210a, the first connection portion 210a is connected to the second type semiconductor layer 126a, wherein the first connection portion 210a and the light emitting layer 124a are respectively located on two opposite sides of the second type semiconductor layer 126a, and the second type semiconductor layer 126a and the first type semiconductor layer 122a are respectively located on two opposite sides of the light emitting layer 124a.

Here, under the same etching condition, the etching rate of the material of the first connection layer 110a may be greater than the etching rate of the first insulating layer 140a so as not to affect the first insulating layer 140a disposed on each of the first type epitaxial structures 120a during the process of removing the first connection layer 110a via etching. In an embodiment of the invention, the first connection layer 110a and the first insulating layer 140a may be formed of the same material, and the density of the material of the first connection layer 110a is greater than the density of the material of the first insulating layer 140a. In another embodiment of the invention, the first connection layer 110a and the first insulating layer 140a may be formed of different materials. For example, the material of the first connection layer 110a may be silicon dioxide, and the material of the first insulating layer 140a may be silicon nitride; the invention provides no limitation thereto.

In the embodiment, a side surface 141a of each of the first insulating layers 140a is aligned with a side surface 211a of the first connection portion 210a of the corresponding first type epitaxial structures 120a. Therefore, the orthogonal projection area of each of the first connection portions 210a on the first substrate 180a is equal to the orthogonal projection area of the corresponding first type epitaxial structure 120a on the first substrate 180a. In other words, the orthogonal projection of each of the first type epitaxial structures 120a on the first substrate 180a completely overlaps the orthogonal projection of the corresponding first connection portion 210a on the first substrate 180a. In other embodiments, the side surface of each of the first connection portions may slightly surpass the side surface of the first insulating layer of the corresponding first type epitaxial structure; therefore, the orthogonal projection area of each of the first connection portions on the first substrate is larger than the orthogonal projection area of the corresponding first type epitaxial structure on the first substrate. Preferably, a ratio of the orthogonal projection area of each of the first connection portions on the first substrate to the orthogonal projection area of the corresponding first type epitaxial structure on the first substrate is smaller than or equal to 1.1. If the ratio is larger than 1.1, then the first type epitaxial structures cannot be closely arranged, which affects the application efficiency of the first type epitaxial structures in the micro light emitting diode device in the subsequent process. That is to say, the orthogonal projection of each of the first type epitaxial structures on the first substrate falls within the orthogonal projection of the corresponding first connection portion on the first substrate.

Figure 8:
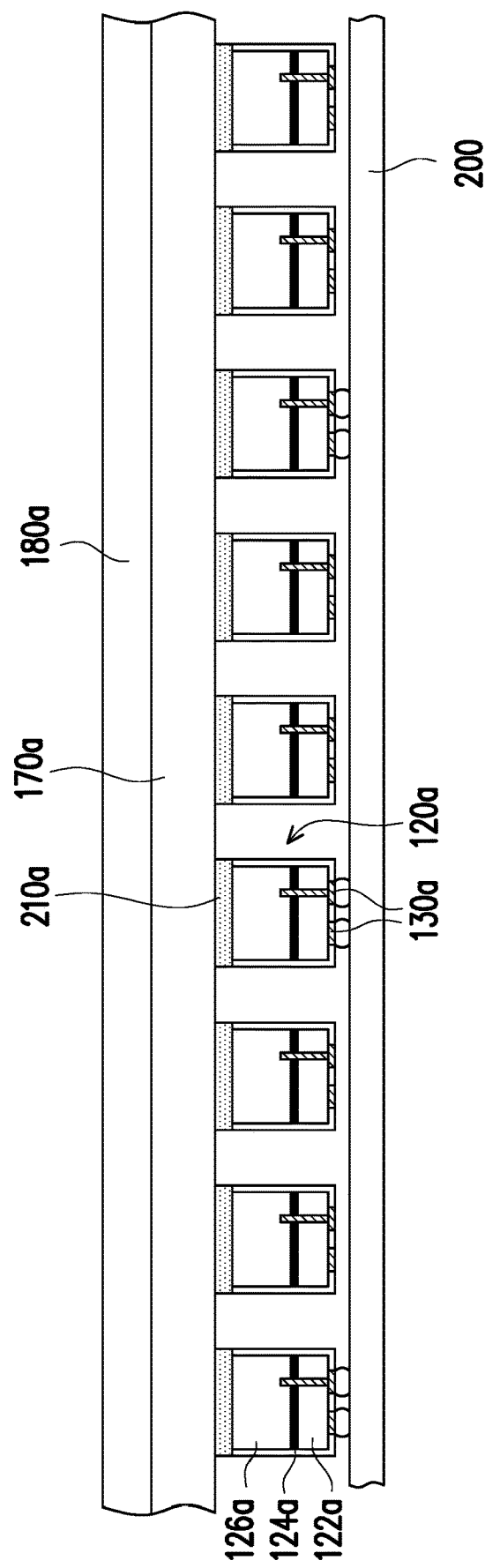
Figure 9:
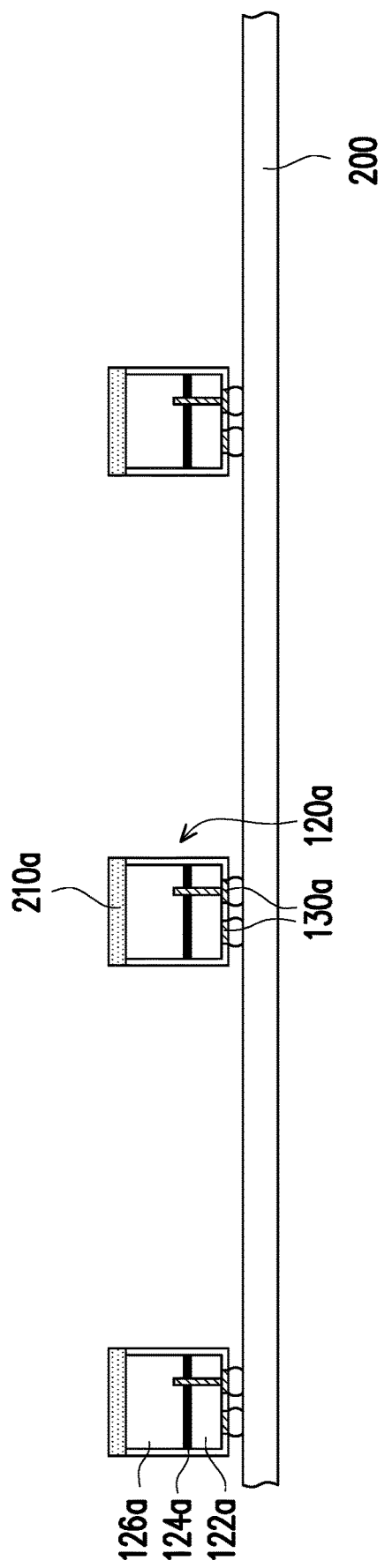

Referring to FIG. 8, at least a portion of the first type epitaxial structures 120a are configured to electrically bond the corresponding pad 130a to the target substrate 200 via a bonding process such as a thermal bonding process. Here, only a portion of the first type epitaxial structures 120a are bonded to the target substrate 200 via the bonding process. In an embodiment that is not shown, the whole first type epitaxial structure may be transferred to the target substrate. Referring to FIG. 9, the first substrate 180a is removed via a laser lift-off process or other proper removing process. Next, the first adhesive layer 170a is removed via the wet-etching process or other proper removing process. In the embodiment, each of the first connection portions 210a is disposed on the second type second semiconductor layer 126a, wherein the ratio of the thickness of each of the first connection portions 210a to the thickness of the corresponding first type epitaxial structure 120a is larger than 0.01 and smaller than or equal to 0.5.

In the manufacturing process, the relative positions of the first type epitaxial structures 120a are not shifted. Therefore, when the first type epitaxial structures 120a are transferred onto the target substrate 200, the pads 130a on the first type epitaxial structures 120a can be precisely aligned with an electrode bonding layer (not shown) on the target substrate 200, thereby improving manufacturing efficiency and yield of rate.

Figure 10:
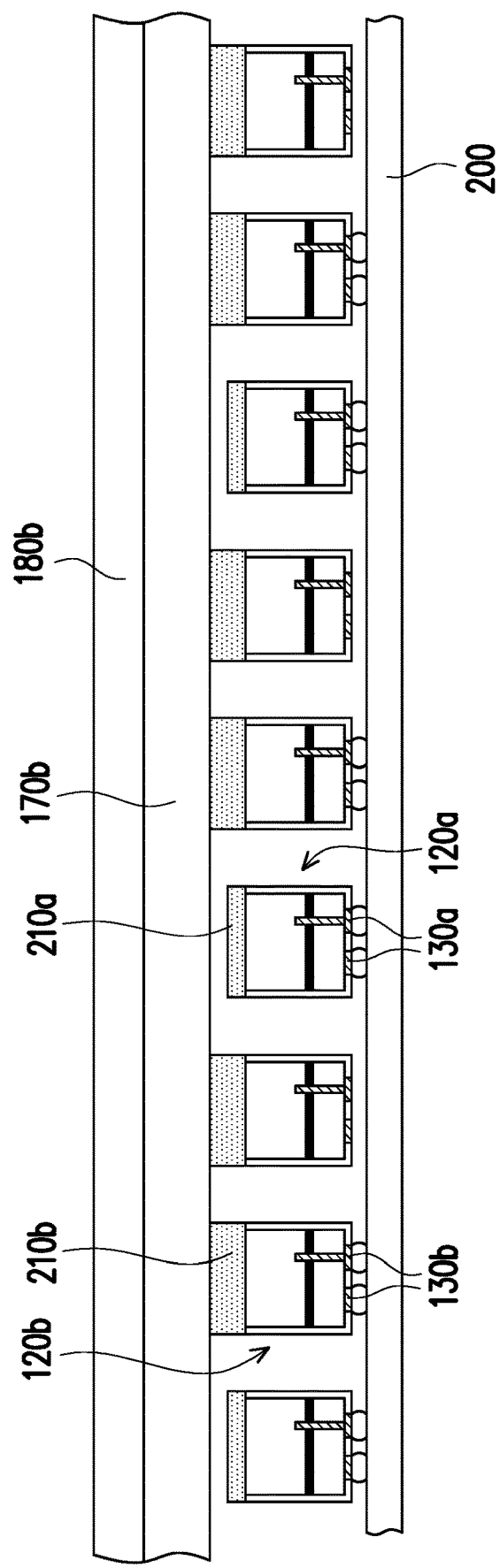

Referring to FIG. 10, in the embodiment, after the first type epitaxial structures 120a are transferred onto the target substrate 200, a step of forming a plurality of second type epitaxial structures 120a on a second substrate 180b is further involved. The second type epitaxial structures 120b are separated from each other, wherein a second connection portion 210b is configured between each of the second type epitaxial structures 120b and the second substrate 180b, and the second connection portions 210b are connected to the second substrate 180a via a second adhesive layer 170b. The first type epitaxial structures 120a and the second type epitaxial structures 120b may have different light colors. Thereafter, at least a portion of the second type epitaxial structures 120b are configured to electrically bond corresponding pads 130b to the target substrate 200 via a bonding process such as a thermal bonding process. It should be specifically pointed out that the steps illustrated in FIG. 1 to FIG. 7 may serve as reference for the steps of forming the second type epitaxial structures 120b and connecting the second connection portions 210b to the second substrate 180b via the second adhesive layer 170b; no repetition is incorporated herein. After at least the portion of the second type epitaxial structures 120b are configured to electrically bond the corresponding pads 130b to the target substrate 200 via the bonding process, the second substrate 180b may be removed via a laser lift-off process or other proper removing process. Next, the second adhesive layer 170b is removed by a wet-etching process or other proper removing process. It should be specifically pointed out that each of the second connection portions 210b and the corresponding second type epitaxial structure 120b also have the same or similar structural features as each of the first connection portions 210a and the corresponding the first type epitaxial structure 120a.

Here, the total thickness of each of the first type epitaxial structures 120a and the corresponding first connection portion 210a is smaller than the total thickness of each of the second type epitaxial structures 120b and the corresponding second connection portion 210b. On the premise that the thickness of each of the first type epitaxial structures 120a is equivalent to the thickness of each of the second type epitaxial structures 120b, the thickness of each of the first connection portions 210a is smaller than the thickness of each of the second connection portions 210b, and each of the first type epitaxial structures 120a is electrically bonded to the target substrate 200 in order and each of the second type epitaxial structures 120b is electrically bonded to the target substrate 200. That is to say, based on the order of the total thickness of the epitaxial structure and the corresponding connection portion, each of the first type epitaxial structures 120a and the corresponding first connection portion 210a with the least total thickness are transferred onto the target substrate 200 first, then each of the second type epitaxial structures 120b and the corresponding second connection portion 210b with a more total thickness are transferred onto the target substrate 200. Since the total thickness of each of the first type epitaxial structures 120a and the corresponding first connection portion 210a that are first transferred onto the target substrate 200 is thinner, when each of the second type epitaxial structures 120 and the corresponding second connection portion 210 are transferred onto the target substrate 200 subsequently, the second adhesive layer 170b is not brought into contact with the first type epitaxial structures 120a and the first connection portion 210a that are already transferred onto the target substrate 200 so as to avoid causing damage to the first type epitaxial structures 120a and the first connection portions 210a that are already transferred onto the target substrate 200 due to pressure.

Figure 11:
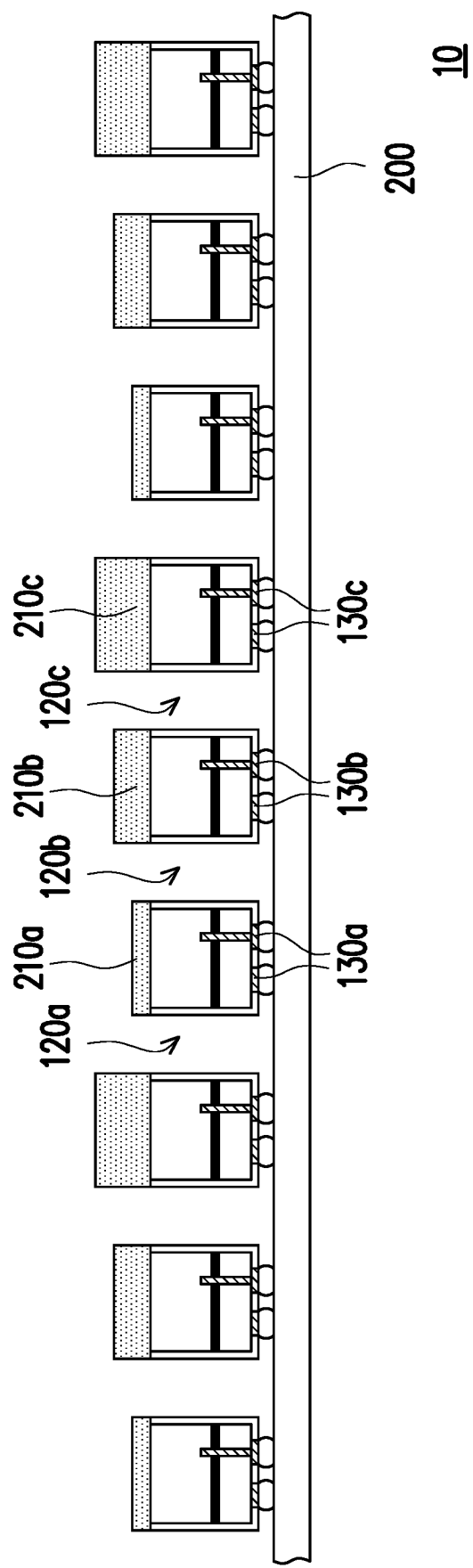

Further referring to FIG. 11, FIG. 11 schematically illustrates an aspect that a third type epitaxial structure 120c and a corresponding third connection portion 210c with the greatest total thickness are transferred onto the target substrate 200. For example, the steps described in FIG. 1 to FIG. 10 may serve as reference for the steps of forming the third type epitaxial structure 120c and the corresponding third connection portion 210c as well as transferring each of the second type epitaxial structures 120b and the corresponding second connection portion 210b onto the target substrate 200; no repetition is incorporated herein. It should be specifically indicated that each of the third connection portions 210c and the corresponding third type epitaxial structure 120c also have the same or similar structural features as each of the first connection portions 210a and the corresponding first type epitaxial structure 120a. Here, before each of the third type epitaxial structures 120c and the corresponding third connection portion 210c are transferred onto the target substrate 200, each of the first type epitaxial structures 120a and the corresponding first connection portion 210a as well as each of the second type epitaxial structures 120b and the corresponding second connection portion 210b are transferred onto the target substrate 200 in order.

Since the total thickness of each of the third type epitaxial structures 120c and the corresponding third connection portion 210c is the thickest, when each of the third type epitaxial structures 120c and the corresponding third connection portion 210c are transferred onto the target substrate 200, a third adhesive layer (not shown) is not brought into contact with the first type epitaxial structures 120a and the first connection portions 210a and the second type epitaxial structures 120b and the second connection portions 210b that are already transferred onto the target substrate 20, thereby avoiding causing damage to the first type epitaxial structures 120a and the first connection portions 210a as well as the second type epitaxial structures 120b and the second connection portions 210b that are already transferred onto the target substrate 200 due to pressure.

In the embodiment, the connection portions (including the first connection portions 210a, the second connection portions 210b and the third connection portions 210c) and the target substrate 200 are respectively located on two opposite sides of the epitaxial structures (including the first type epitaxial structures 120a, the second type epitaxial structures 120b and the third type epitaxial structures 120c). For example, the target substrate 200 may be a circuit substrate. The circuit substrate is practically implemented as a display panel such as a contemporary metal oxide semiconductor (CMOS) substrate, a liquid crystal on silicon (LCOS) substrate, a thin film transistor (TFT) substrate or other substrate having a working circuit, wherein a side where the circuit substrate (i.e., the target substrate 200) is bonded to the epitaxial structures (including the first type epitaxial structures 120a, the second type epitaxial structures 120b and the third type epitaxial structures 120c) is provided with an electrode bonding layer (not shown), and each of the epitaxial structures (including the first type epitaxial structures 120a, the second type epitaxial structures 120b and the third type epitaxial structures 120c) is electrically bonded to the electrode bonding layer (not shown) via the corresponding pad (including pads 130a to 130c) using a flip-chip bonding process so as to be electrically connected to the target substrate 200. Specifically, the first type epitaxial structures 120a, the second type epitaxial structures 120b and the third type epitaxial structures 120c may have different light colors. For example, the first type epitaxial structures 120a, the second type epitaxial structures 120b and the third type epitaxial structures 120c may be a combination of a red light micro epitaxial structure (or referred to as red light micro light emitting diode), a green light micro epitaxial structure (or referred to as green light micro light emitting diode) and a blue light micro epitaxial structure (or referred to as blue light micro light emitting diode).

In the manufacturing process, the relative positions of the epitaxial structures (including the first type epitaxial structures 120a, the second type epitaxial structures 120b and the third type epitaxial structures 120c) are not shifted. Therefore, when the epitaxial structures (including the first type epitaxial structures 120a, the second type epitaxial structures 120b and the third type epitaxial structures 120c) are transferred onto the target substrate 200, the pad (including the boning pads 130a to 130c) on each of the epitaxial structures (including the first type epitaxial structures 120a, the second type epitaxial structures 120b and the third type epitaxial structures 120c) can be precisely aligned with the electrode bonding layer (not shown) on the target substrate 200, thereby improving manufacturing efficiency and yield of rate.

In the embodiment, the orthogonal projection area of each of the first connection portions 210a on the target substrate 200 is equivalent to the orthogonal projection area of the corresponding first type epitaxial structure 120a on the target substrate 200. In other words, the orthogonal projection of each of the first type epitaxial structures 120a on the target substrate 200 completely overlaps the orthogonal projection of the corresponding first connection portion 210a on the target substrate 200. It should be specifically indicated that each of the second connection portions 210b and the corresponding second type epitaxial structure 120b also have the same or similar structural features as described above, and each of the third connection portions 2110c and the corresponding third type epitaxial structure 120c also have the same or similar structural features as described above. In other embodiment, the side surface of each of the connection portions may slightly surpass the side surface of the insulating layer on the corresponding epitaxial structure; therefore, the orthogonal projection area of each of the connection portions on the target substrate is larger than the orthogonal projection area of the corresponding epitaxial structure on the circuit substrate. Preferably, the proportion of the orthogonal projection area of each of the connection portions on the target substrate to the orthogonal projection area of the corresponding epitaxial structure on the target substrate is larger than 1 and smaller than or equal to 1.1. That is to say, the orthogonal projection of each of the epitaxial structure on the target substrate falls within the orthogonal projection of the corresponding connection portion on the target substrate.

The above manufacturing step shows that the connection portions (including the first connection portions 210a, the second connection portions 210b and the third connection portions 210c) separated from each other are formed by partially removing the connection layers (including the first connection layers 110a, the second connection layers (not shown) and the third connection layers (not shown)), wherein a ratio of the thickness of each of the connection portions (including the first connection portions 210a, the second connection portions 210b and the third connection portions 210c) to the thickness of the corresponding epitaxial structures (including the first type epitaxial structures 120a, the second type epitaxial structures 120b and the third type epitaxial structures 120c) is larger than 0.01 and smaller than or equal to 0.5, which represents that the ratio of the thickness of the connection layers (including the first connection layers 110a, the second connection layers (not shown) and the third connection layers (not shown)) to the thickness of the corresponding epitaxial structures (including the first type epitaxial structures 120a, the second type epitaxial structures 120b and the third type epitaxial structures 120c) is also larger than 0.01 and smaller than or equal to 0.5. If the ratio of the thickness of the connection layers (including the first connection layers 110a, the second connection layers (not shown) and the third connection layers (not shown)) to the thickness of the corresponding epitaxial structures (including the first type epitaxial structures 120a, the second type epitaxial structures 120b and the third type epitaxial structures 120c) is larger than 0.5, then it is difficult to carry out the process of partially removing the connection layers (including the first connection layers 110a, the second connection layers (not shown) and the third connection layers (not shown)). If the thickness ratio is smaller than or equal to 0.01, the bonding force between the connection layers (including the first connection layers 110a, the second connection layers (not shown) and the third connection layers (not shown)) and the corresponding epitaxial structures (including the first type epitaxial structures 120a, the second type epitaxial structures 120b and the third type epitaxial structures 120c) becomes too weak. Specifically, the thickness of each of the epitaxial structures (including the first type epitaxial structures 120a, the second type epitaxial structures 120b and the third type epitaxial structures 120c) is 5 μm for example, and the thickness of the corresponding connection portions (including the first connection layers 110a, the second connection layers (not shown) and the third connection layers (not shown)) is 0.1 to 2 μm for example, which should not be construed as a limitation to the invention. It should be specifically pointed out that the ratio of the thickness of the connection portions (including the first connection portions 210a, the second connection portions 210b and the third connection portions 210c) to the maximum width of the corresponding epitaxial structures (including the first type epitaxial structures 120a, the second type epitaxial structures 120b and the third type epitaxial structures 120c) ranges from 0.001 to 0.3. When the ratio is smaller than 0.001, the thickness of the connection portions (including the first connection portions 210a, the second connection portions 210b and the third connection portions 210c) is too thin, and the insufficient bonding force may cause the relative positions of the epitaxial structures (including the first type epitaxial structures 120a, the second type epitaxial structures 120b and the third type epitaxial structures 120c) to change during process. When the ratio is larger than 0.3, the thickness of the connection portions (including the first connection portions 210a, the second connection portions 210b and the third connection portions 210c) is too thick, which is likely to make it difficult to carry out the process of partially removing the over-thick connection layers (including the first connection layers 110a, the second connection layers (not shown) and the third connection layers (not shown)), and reduces the yield rate of the process of forming each of the connection portions (including the first connection portions 210a, the second connection portions 210b and the third connection portions 210c). Preferably, when the maximum width of the epitaxial structures (including the first type epitaxial structures 120a, the second type epitaxial structures 120b and the third type epitaxial structures 120c) is smaller than 50 μm, a ratio of the thickness of the connection portions (including the first connection portions 210a, the second connection portions 210b and the third connection portions 210c) to the maximum width of the corresponding epitaxial structures (including the first type epitaxial structures 120a, the second type epitaxial structures 120b and the third type epitaxial structures 120c) ranges from 0.002 to 0.2. When the maximum width of the epitaxial structures (including the first type epitaxial structures 120a, the second type epitaxial structures 120b and the third type epitaxial structures 120c) is larger than or equal to 50 μm, a ratio of the thickness of the connection portions (including the first connection portions 210a, the second connection portions 210b and the third connection portions 210c) to the maximum width of the corresponding epitaxial structures (including the first type epitaxial structures 120a, the second type epitaxial structures 120b and the third type epitaxial structures 120c) ranges from 0.001 to 0.04.

In the embodiment, the micro light emitting diode device 10 includes the circuit substrate (i.e., target substrate 200), a plurality of epitaxial structures (including the first type epitaxial structures 120a, the second type epitaxial structures 120b and the third type epitaxial structures 120c), a plurality of pads (including pads 130a to 130c) and a plurality of connection portions (including the first connection portions 210a, the second connection portions 210b and the third connection portions 210c). The epitaxial structures (including the first type epitaxial structures 120a, the second type epitaxial structures 120b and the third type epitaxial structures 120c) are disposed on the circuit substrate (i.e., target substrate 200) and separated from each other. The pads (including pads 130a to 130c) are respectively disposed on the epitaxial structures (including the first type epitaxial structures 120a, the second type epitaxial structures 120b and the third type epitaxial structures 120c), and the epitaxial structures (including the first type epitaxial structures 120a, the second type epitaxial structures 120b and the third type epitaxial structures 120c) are electrically bonded to the circuit substrate (i.e., target substrate 200) via the corresponding pads (including pads 130a to 130c). The connection portions (including the first connection portions 210a, the second connection portions 210b and the third connection portions 210c) are respectively disposed on the epitaxial structures (including the first type epitaxial structures 120a, the second type epitaxial structures 120b and the third type epitaxial structures 120c), and provided with light-guiding function so that the epitaxial structures have a better light emitting efficiency. More specifically, the refractive index of the connection portions (including the first connection portions 210a, the second connection portions 210b and the third connection portions 210c) may be smaller than the refractive index of the epitaxial structures (including the first type epitaxial structures 120a, the second type epitaxial structures 120b and the third type epitaxial structures 120c) and larger than the refractive index of air, so as avoid total reflection generated in the epitaxial structure during light emission and affect the light emitting efficiency. The connection portions (including the first connection portions 210a, the second connection portions 210b and the third connection portions 210c) and the circuit substrate (i.e., target substrate 200) are respectively located on two opposite sides of the epitaxial structures (including the first type epitaxial structures 120a, the second type epitaxial structures 120b and the third type epitaxial structures 120c), and the epitaxial structures (including the first type epitaxial structures 120a, the second type epitaxial structures 120b and the third type epitaxial structures 120c) and the circuit board (i.e., target substrate 200) are respectively located on two opposite sides of the pads (including pads 130a to 130c). The material of the connection portions (including the first connection portions 210a, the second connection portions 210b and the third connection portions 210c) may be an insulating material and the melting point thereof is greater than 1000° C. For example, the material of the connection portions (including the first connection portions 210a, the second connection portions 210b and the third connection portions 210c) may include silicon nitride, or includes a group consisting of oxides selected from silicon, aluminum, hafnium, zirconium, tantalum and titanium, such as silicon dioxide or aluminum oxide.

Figure 12:
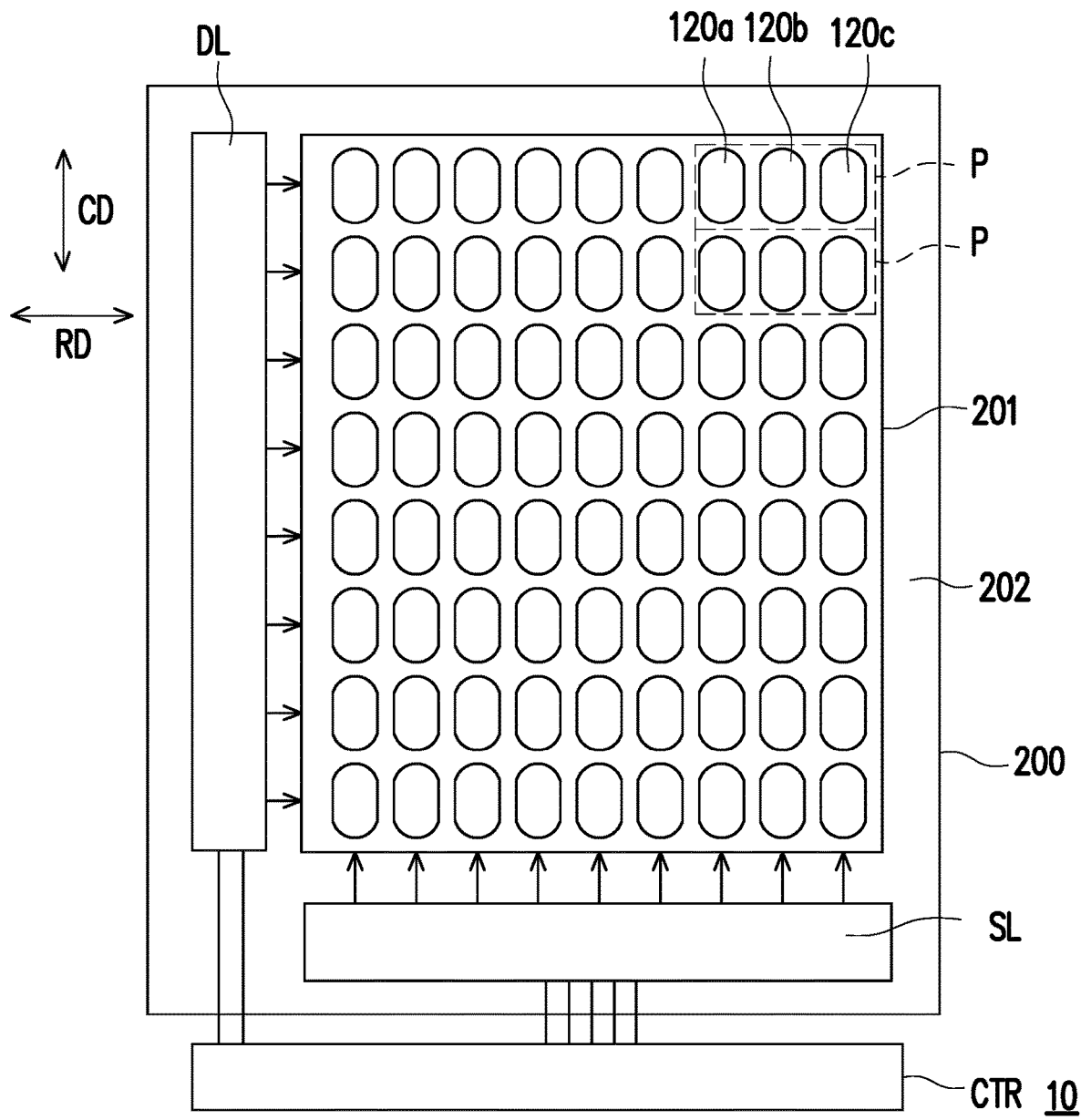
FIG. 12 is a top view illustrating a micro light emitting diode device according to an embodiment of the invention.

FIG. 12 is a top view illustrating a micro light emitting diode device according to an embodiment of the invention. Referring to FIG. 12, in the embodiment, the micro light emitting diode device 10 is practically implemented as a micro light emitting diode display panel. Practically, with the manufacturing steps described above, the first type epitaxial structure 120a, the second type epitaxial structure 120b and the third type epitaxial structure 120c can be obtained respectively. Meanwhile, the first type epitaxial structure 120a, the second type epitaxial structure 120b and the third type epitaxial structure 120c may respectively have different light colors. For example, the first type epitaxial structure 120a, the second type epitaxial structure 120b and the third type epitaxial structure 120c may be a combination of a red light micro epitaxial structure (or referred to as red light micro light emitting diode), a green light micro epitaxial structure (or referred to as green light micro light emitting diode) and a blue light micro epitaxial structure (or referred to as blue light micro light emitting diode). The micro light emitting diode device 10 can obtained by transferring the first type epitaxial structure 120a, the second type epitaxial structure 120b and the third type epitaxial structure 120c respectively to the circuit substrate (i.e., target substrate 200). Specifically, the first type epitaxial structure 120a are formed as one column on the circuit substrate (i.e., target substrate 200); the second type epitaxial structure 120b are formed as one column on the circuit substrate (i.e., target substrate 200); and the third type epitaxial structure 120c are formed as one column on the circuit substrate (i.e., target substrate 200). Therefore, in a row direction RD perpendicular to the column direction CD, the arrangement in the order of the first type epitaxial structure 120a, the second type epitaxial structure 120b and the third type epitaxial structure 120c may be repeated. In other embodiment, the sequence of arrangement of the red light micro light emitting diode, the green light micro light emitting diode and the blue light micro light emitting diode in the row direction may be adjusted depending on the actual requirement; the invention provides no limitation thereto.

The circuit substrate (i.e., target substrate 200) may be divided into a display area 201 and a non-display area 202. The first type epitaxial structure 120a, the second type epitaxial structure 120b and the third type epitaxial structure 120c arranged adjacently in sequence in the row direction RD may construct a pixel structure P, and disposed in the display area 201. In other words, at least three epitaxial structures may construct a pixel structure P. On the other hand, a data driving circuit DL and a scan driving circuit SL are disposed in the non-display area 202, wherein the data driving circuit DL is electrically connected to each of the pixel structures P to transmit a data signal to the first type epitaxial structure 120a, the second type epitaxial structure 120b and the third type epitaxial structure 120c in each of the pixel structures, wherein the scan driving circuit SL is electrically connected to each of the pixel structures P to transmit a scan signal to the first type epitaxial structure 120a, the second type epitaxial structure 120b and the third type epitaxial structure 120c in each one of the pixel structures. Each of the pixel structures P is electrically connected a control device CTR via the data driving circuit DL and the scan driving circuit SL, wherein the control device CTR is configured to send a control signal to the data driving circuit DL and the scan driving circuit SL. The data driving circuit DL and the scan driving circuit SL that receive the control signal respectively send the data signal and the scan signal to each of the pixel structures P so as to control and drive the light emitted by the first type epitaxial structure 120a, the second type epitaxial structure 120b and the third type epitaxial structure 120c in each of the pixel structures P.

Figure 13:
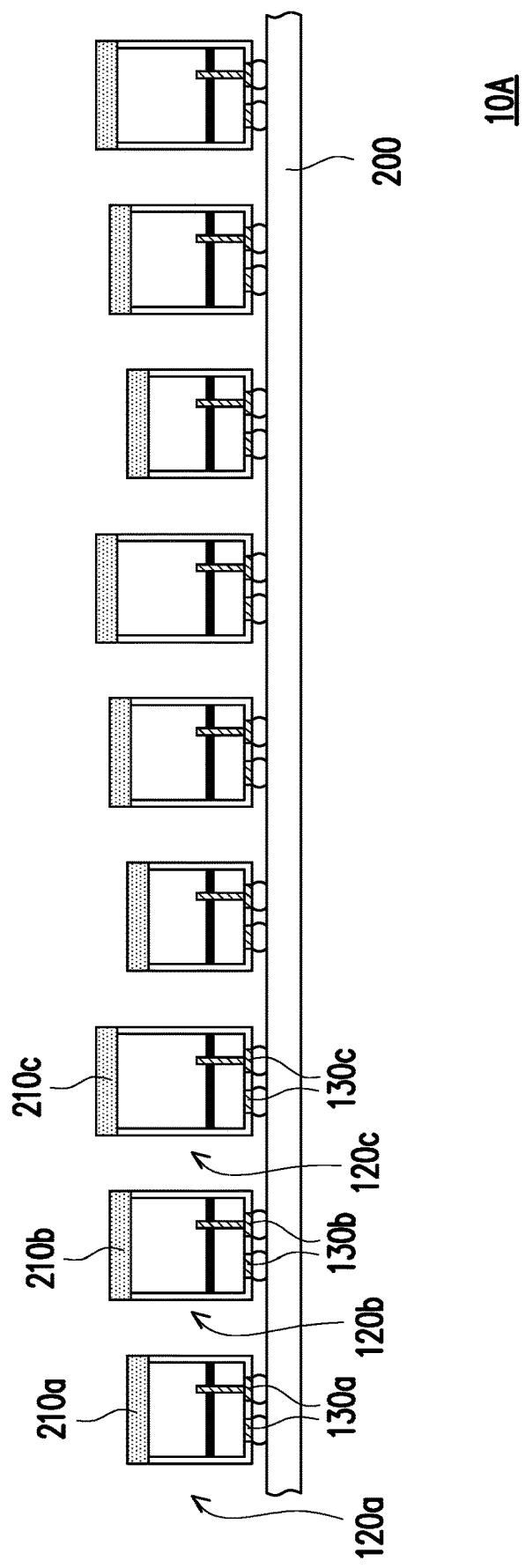
FIG. 13 is a cross-sectional view illustrating a micro light emitting diode device according to another embodiment of the invention.

FIG. 13 is a cross-sectional view illustrating a light emitting diode device according to another embodiment of the invention. Referring to FIG. 13, a light emitting device 10A in the embodiment is substantially similar to the light emitting device 10 in the previous embodiment. The difference between the two is that the thickness of each of first connection portions 210a, the thickness of each of second connection portions 210b and the thickness of each of third connection portions 210c are equivalent to one another. On the premise that the total thickness of each of first type epitaxial structures 120a and the corresponding first connection portions 210a is smaller than the total thickness of each of second type epitaxial structures 120b and the corresponding second connection portions 210b, and the total thickness of each of second type epitaxial structures 120b and the corresponding second connection portion 210b is smaller than the total thickness of each of third type epitaxial structures 120c and the corresponding third connection portion 210c, the thickness of each of first type epitaxial structures 120a is smaller than the thickness of each of second type epitaxial structures 120b, and the thickness of each of second type epitaxial structures 120b is smaller than the thickness of each of third type epitaxial structures 120c. On the other hand, the embodiments provided above may serve as reference for the sequence in which the epitaxial structures are transferred onto the target substrate 200; no repetition is incorporated wherein. With the design that the thickness of each of first connection portions 210a, the thickness of each of second connection portions 210b and the thickness of each of third connection portions 210c are equivalent to one another, the manufacturing process may be simpler.

Figure 14:
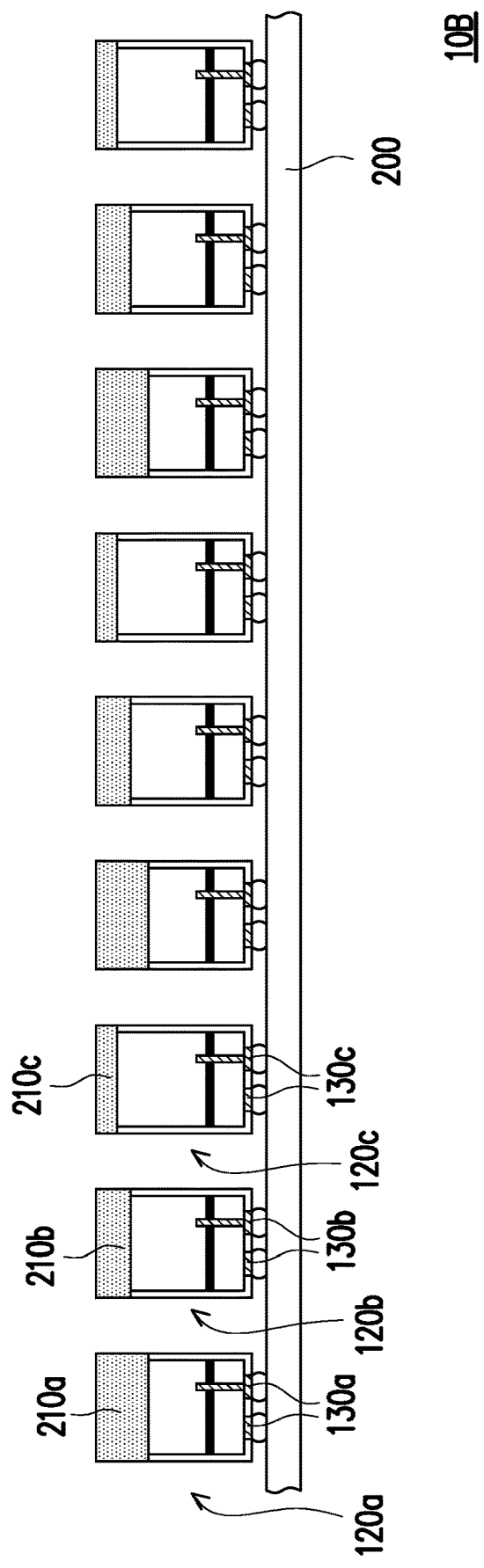
FIG. 14 is a cross-sectional view illustrating a micro light emitting diode device according to yet another embodiment of the invention.

FIG. 14 is a cross-sectional view illustrating a micro light emitting diode device according to yet another embodiment of the invention. Referring to FIG. 14, a light emitting device 10B in the embodiment is substantially similar to the light emitting device 10 in the previous embodiment. The difference between the two is that the total thickness of each of first type epitaxial structures 120a and corresponding first connection portion 210a, the total thickness of each of second type epitaxial structures 120b and corresponding second connection portion 210b and the total thickness of each of third type epitaxial structures 120c and corresponding third connection portion 210c are equivalent to one another. The thickness of each of first type epitaxial structures 120a is smaller than the thickness of each of second type epitaxial structures 120b, and the thickness of each of second type epitaxial structures 120b is smaller than the thickness of each of third type epitaxial structures 120c. Therefore, the thickness of each of first connection portions 210a is larger than the thickness of each of second connection portions 210b, and the thickness of each of second connection portions 210b is larger than the thickness of each of the third connection portions 210c. According to the thickness of the first connection portions 210a, the second connection portions 210b and the third connection portions 210c, each of the first type epitaxial structures 120a provided with the first connection portion 210a having the greatest thickness is transferred onto the circuit substrate (i.e., target substrate 200) first; then each of the second type epitaxial structures 120b provided with the second connection portion 210b having less thickness is transferred onto the circuit substrate (i.e., target substrate 200); lastly each of third type epitaxial structures 120c provided with the third connection portion 210c having the least thickness is transferred onto the circuit substrate (i.e., target substrate 200). Since the epitaxial structure that is transferred onto the circuit substrate (i.e., target substrate 200) first is provided with the connection portion having a thicker thickness, a buffering effect can be rendered so as to avoid causing damage to the epitaxial structure that is already transferred to the circuit substrate (i.e., target substrate 200) due to pressure. It should be specifically indicated that the Young's modulus of the first connection portion 210a, the second connection portion 210b and the third connection portion 210c are respectively smaller than the Young's modulus of the first type epitaxial structure 120a, the second type epitaxial structure 120b and the third type epitaxial structure 120c, such that a better buffering effect can be rendered.

Figure 15:
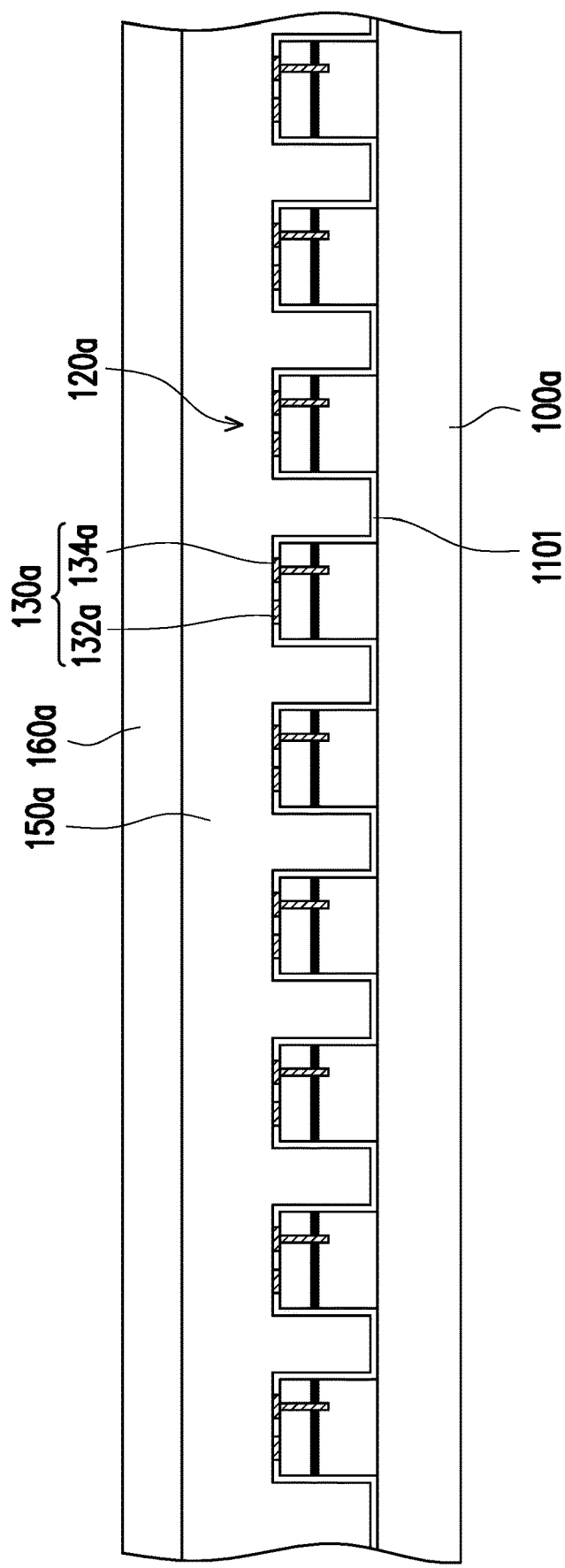
FIG. 15 to FIG. 16 are cross-sectional views illustrating a manufacturing method of a micro light emitting diode device according to still another embodiment of the invention.
Figure 16:
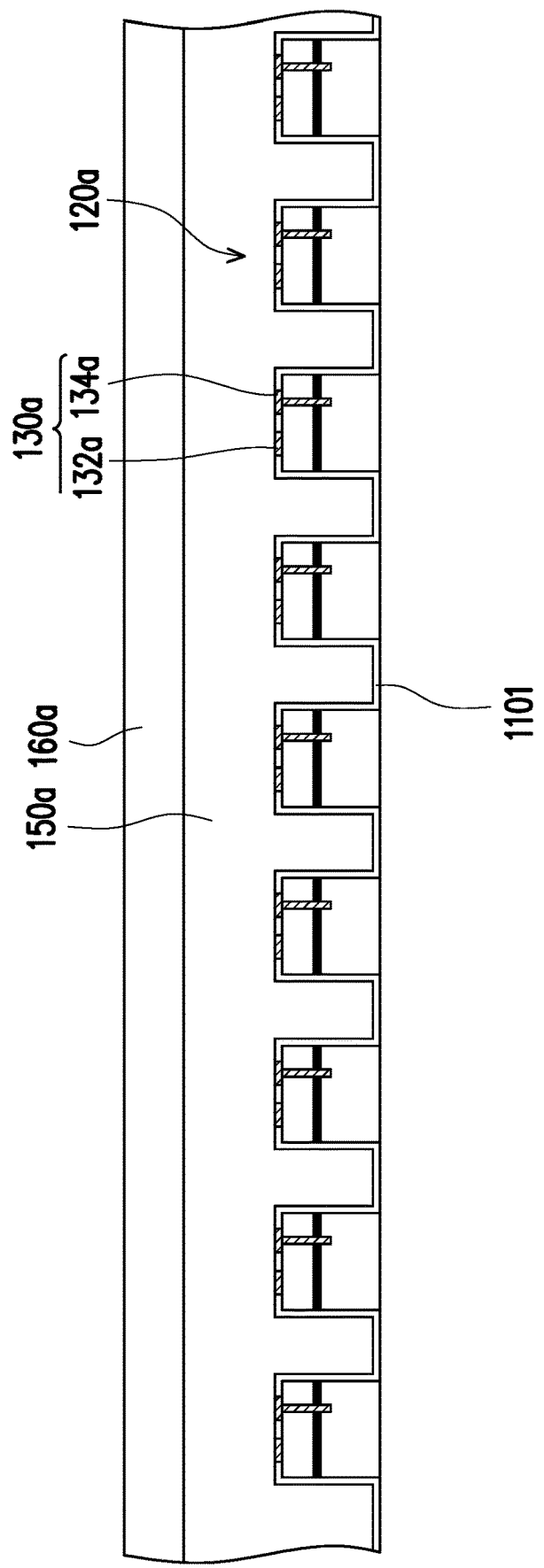

FIG. 15 to FIG. 16 are cross-sectional views illustrating a manufacturing method of a micro light emitting diode device according to still another embodiment of the invention. Referring to FIG. 15 to FIG. 16, the manufacturing method of the light emitting device of the embodiment is substantially similar to the manufacturing method of the light emitting device 10 of the previous embodiment. The difference between the two is that, in the light emitting device of the embodiment, after the first type epitaxial structure 120a separated from each other is formed on the first growth carrier 100a, a first connection layer 1101 is formed. Thereafter, a temporary fixing layer 150a is formed, and the first type epitaxial structures 120a are bonded to a temporary substrate 160a via the temporary fixing layer 150a.

Thereafter, referring to FIG. 16, the first growth carrier 100a is removed. That is to say, the first connection layer 1101 of the embodiment is formed before the first growth carrier 100a is removed. The steps illustrated in FIG. 5 to FIG. 9 may serve as reference for the subsequent step where the first type epitaxial structure 120a is electrically bonded to the target substrate 200; no repetition is incorporated herein. With the first connection layer 1101, the relative positions of the first type epitaxial structures 120a can be fixed, such that the first type epitaxial structures 120a can be precisely aligned on the target substrate 200. It should be specifically pointed out that the first connection layer 1101 that is formed on each of first type epitaxial structures 120a may expose the pad 130a on the corresponding first type epitaxial structure 120a so as to be electrically bonded to the target substrate in the subsequent process.

In summary, in the manufacturing process of the micro light emitting diode device of the invention, the relative positions of the plurality of first type epitaxial structures may be fixed via the first connection layer, when the first adhesive layer is formed on the first connection layer and the first substrate is adhered to the first adhesive layer in the subsequent process, even if the first adhesive layer flows due to being subjected to heat or force, the relative positions of the first type epitaxial structures are not shifted due to the impact caused by the first adhesive layer that flows. Therefore, when the first type epitaxial structures are transferred onto the target substrate, the pad on each of first type epitaxial structures can be precisely aligned with the electrode bonding layer on the target substrate. In other words, the manufacturing method of the micro light emitting diode device of the invention facilitates to improve manufacturing efficiency and yield of rate; moreover, the obtained micro light emitting diode device can have good reliability.

Furthermore, in terms of configuration of thickness, the total thickness of one of at least two epitaxial structures that can emit different light colors and the corresponding connection portion may be set to be smaller than the total thickness of the other of the two epitaxial structures and the corresponding connection portion. Also, in the transferring process, one of the epitaxial structures and the corresponding connection portion with the thinner total thickness are transferred to the circuit substrate first, then the other one of the epitaxial structures and the corresponding connection portion with a thicker thickness are transferred to the circuit substrate, so as to avoid causing damage to the epitaxial structure and the connection portion thereon that are already transferred onto the circuit substrate due to pressure.

Alternatively, the total thickness of at least one of the two epitaxial structures that can emit different light colors and the corresponding connection portion may be set to be equivalent to the total thickness of the two epitaxial structures and the corresponding connection portion. Also, in the transferring process, one of the epitaxial structures having the connection portion with a thicker thickness is transferred to the target substrate first, then the other one of the epitaxial structures having the connection portion with a thinner thickness is transferred to the target substrate. Since the epitaxial structure that is already transferred onto the circuit substrate is provided with the connection portion having a thicker thickness, a buffering effect can be rendered so as to avoid causing damage to the epitaxial structure that is already transferred onto the target substrate due to pressure.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A manufacturing method of a micro light emitting diode device, comprising:
   (a) forming a plurality of first type epitaxial structures on a first substrate, and the plurality of first type epitaxial structures are separated from each other, wherein a first connection layer and a first adhesive layer are configured between the plurality of first type epitaxial structures and the first substrate, the first connection layer is connected to the plurality of first type epitaxial structures, and the first adhesive layer is located between the first connection layer and the first substrate, wherein a Young's modulus of the first connection layer is larger than a Young's modulus of the first adhesive layer; and
   (b) removing the first connection layer located between any two adjacent of the plurality of first type epitaxial structures so as for form a plurality of first connection portions separated from each other, wherein each of the plurality of first connection portions is respectively connected to each of the corresponding first type epitaxial structures,
   wherein a ratio of a thickness of each of the plurality of first connection portions to a thickness of each of the corresponding first type epitaxial structures is larger than 0.01 and smaller than or equal to 0.5;
   forming a plurality of second type epitaxial structures, separately disposed on a second substrate;
   forming a plurality of second connection portions, respectively and correspondingly disposed on a side of each of the plurality of second type epitaxial structures away from a target substrate, wherein a ratio of a thickness of each of the plurality of second connection portions to a thickness of each of the corresponding second type epitaxial structures is larger than or equal to 0.01 and smaller than or equal to 0.5; and
   wherein a thickness of each of the first connection portions is different from a thickness of each of the second connection portions, and the plurality of first type epitaxial structures and the plurality of second type epitaxial structures respectively emit different light colors.

2. The manufacturing method of the micro light emitting diode device according to claim 1, further comprising:
   (c) bonding a portion of the plurality of first type epitaxial structures to the target substrate electrically.

3. The manufacturing method of the micro light emitting diode device according to claim 1, further comprising:
   (d) wherein a second connection layer and a second adhesive layer are configured between the plurality of second type epitaxial structures and the second substrate, the second connection layer is connected to the plurality of second type epitaxial structures, and the second adhesive layer is located between the second connection layer and the second substrate, wherein a Young's modulus of the second connection layer is larger than a Young's modulus of the second adhesive layer.

4. The manufacturing method of the micro light emitting diode device according to claim 3, further comprising:
   (f) bonding a portion of the plurality of first type epitaxial structures in the step (b) to the target substrate electrically; and
   (g) bonding a portion of the plurality of second type epitaxial structures to the target substrate electrically.

5. The manufacturing method of the micro light emitting diode device according to claim 4, wherein a total thickness of each of the plurality of first type epitaxial structures and each of the corresponding first connection portions is smaller than or equal to a total thickness of each of the plurality of second type epitaxial structures and each of the corresponding second connection portions.

6. The manufacturing method of the micro light emitting diode device according to claim 1, wherein a ratio of a thickness of each of the plurality of first connection portions to a side length of each of the corresponding first type epitaxial structures is larger than 0.001 and smaller than or equal to 0.3.

7. The manufacturing method of the micro light emitting diode device according to claim 1, in the step (b), the first connection layer located between any two adjacent of the plurality of first type epitaxial structures is removed via an etching process so as to form the plurality of first connection portions separated from each other.

8. The manufacturing method of the micro light emitting diode device according to claim 1, in the step (a), the method of forming the plurality of first type epitaxial structures on the first substrate comprises:
   (a-1) forming the plurality of first type epitaxial structures separated from each other on a first growth carrier;
   (a-2) removing the first growth carrier; and
   (a-3) forming the first connection layer and the first adhesive layer, bonding the plurality of first type epitaxial structures to the first substrate via the first adhesive layer.

9. The manufacturing method of the micro light emitting diode device according to claim 8, a step is further comprised between the step (a-1) and the step (a-2):
   (a-1-1) forming a temporary fixing layer so as to bond the plurality of first type epitaxial structures to a temporary substrate, wherein a bonding force between the temporary fixing layer and the temporary substrate is smaller than a bonding force between the first adhesive layer and the first substrate.

10. The manufacturing method of the micro light emitting diode device according to claim 9, wherein the temporary fixing layer further covers the plurality of first type epitaxial structures.

11. The manufacturing method of the micro light emitting diode device according to claim 1, in the step (a), the method for forming the plurality of first type epitaxial structures on the first substrate comprises:
   (a-1) forming the plurality of first type epitaxial structures separated from each other on a first growth carrier;
   (a-2) forming the first connection layer and the first adhesive layer, bonding the plurality of first type epitaxial structures to the first substrate via the first adhesive layer; and
   (a-3) removing the first growth carrier.

* * * * *